(12) United States Patent
Doi

(10) Patent No.: US 7,640,127 B2
(45) Date of Patent: Dec. 29, 2009

(54) DETECTION APPARATUS, DETECTION METHOD, AND PROGRAM

(75) Inventor: Masaru Doi, Tokyo (JP)

(73) Assignee: Advantest Corporation, Tokyo (JP)

( * ) Notice: Subject to any disclaimer, the term of this patent is extended or adjusted under 35 U.S.C. 154(b) by 542 days.

(21) Appl. No.: 11/191,421

(22) Filed: Jul. 28, 2005

(65) Prior Publication Data

US 2005/0259556 A1 Nov. 24, 2005

Related U.S. Application Data

(63) Continuation of application No. PCT/JP2004/001106, filed on Feb. 4, 2004.

(30) Foreign Application Priority Data

Feb. 4, 2003 (JP) ............................ 2003-026866

(51) Int. Cl.
*G01R 35/00* (2006.01)
*G06F 15/00* (2006.01)

(52) U.S. Cl. .................... 702/89; 702/90; 702/110; 702/125; 714/814

(58) Field of Classification Search ............ 702/89–91, 702/94, 110, 113, 117, 118, 124, 125; 714/744, 714/814; 327/141
See application file for complete search history.

(56) References Cited

U.S. PATENT DOCUMENTS 4,686,391 A 8/1987 Gudaitis 6,253,341 B1 * 6/2001 Sugizaki .................... 714/721
2001/0052097 A1 * 12/2001 Miura ........................ 714/744

FOREIGN PATENT DOCUMENTS

| JP | 2-310481 | 12/1990 |
|---|---|---|
| JP | 5-281307 | 10/1993 |
| JP | 9-304482 | 11/1997 |
| JP | 10-332782 | 12/1998 |
| JP | 11-353352 | 12/1999 |
| JP | 2001-337141 | 12/2001 |
| JP | 2001-356153 | 12/2001 |
| JP | 2002-025294 | * 1/2002 |

OTHER PUBLICATIONS

International Search Report for International Application No. PCT/JP2004/001106 mailed on May 25, 2004, 2 pages.
Patent Abstracts of Japan, Publication No. 2001-356153, Publication Date: Dec. 26, 2001, 1 page.

(Continued)

*Primary Examiner*—Eliseo Ramos Feliciano
*Assistant Examiner*—Phuong Huynh
(74) *Attorney, Agent, or Firm*—Osha • Liang LLP

(57) ABSTRACT

There is provided a detection apparatus including a transition point detecting unit operable to receive the output signal to detect the point of transition, a timing comparing unit operable to detect the signal level of the output signal in front of or behind the point of transition in the output signal, and a correction unit operable to compensate the timing of the point of transition detected from the transition point detecting unit based on the signal level of the output signal detected from the timing comparing unit.

15 Claims, 5 Drawing Sheets

OTHER PUBLICATIONS

Japanese Office Action for patent application No. 2003-026866, dated Feb. 10, 2009, and English translation thereof, 3 pages.
English abstract for JP11-353352 from esp@cenet, Publication Date: Dec. 24, 1999, 1 page.
English abstract for JP5-281307, from esp@cenet, Publication Date: Oct. 29, 1993, 1 page.
English abstract for JP2001-337141, from esp@cenet, Publication Date: Dec. 7, 2001, 1 page.

* cited by examiner

DETECTION APPARATUS, DETECTION METHOD, AND PROGRAM

CROSS REFERENCE TO THE RELATED APPLICATION

The present application is a continuation application of PCT/JP2004/001106 filed on Feb. 24, 2004, which claims priority from a Japanese Patent application No. 2003-026866 filed on Feb. 4, 2003, the entire contents of which are incorporated herein by reference for all purposes.

BACKGROUND OF THE INVENTION

1. Field of the Invention

The present invention relates to a detection apparatus that detects a point of transition of a signal level of a signal to be measured.

2. Description of Related Art

Conventionally, in regard to a test of an electronic device such as a semiconductor circuit, there is a test measuring an output signal output from the electronic device and deciding whether the electronic device outputs an output signal according to an expected value. At this time, a testing device that tests the electronic device measures a changed point of time and a changed result of the value of output signal.

The testing device performs a measurement referred to as an edge strobe in order to measure a point of transition of the value of the output signal. The edge strobe measurement technique in which strobes of which phases are sequentially delayed are generated and signal levels of the output signal are sequentially detected in the timing of the generated strobes is known as disclosed, for example, in Japanese Patent Laid-Open No. 2001-356153, particularly page 7, and FIGS. 15 and 16 thereof. In this way, the signal levels of the output signal in a plurality of timings having different phases are detected, the transition points of the value of the output signal are detected, and the changed point of time of the signal level and the changed result of the signal level are measured.

When detecting a signal level in the edge strobe measurement technique, a level comparator receives an output signal and detects the signal level using the strobe as an operation clock. The level comparator compares the signal level of the output signal and a predetermined threshold value in the timing by the strobe, and detects which level the signal level is of an H level or an L level.

A conventional testing device detects the timings of a rising edge and a trailing edge of an output signal in the above-described method. However, when measuring a rising edge and a trailing edge of an output signal in the above-described conventional method, measurement results of both edges can have an error in some cases. For example, even if a rising edge and a trailing edge that varies in the same timing are measured, measurement results of both edges can be different from each other in some cases.

As the reason for the error, a hysteresis characteristic of the level comparator used for the detection of a signal level of an output signal is considered. In other words, since a threshold value to be compared with an output signal in order to detect an H level and a threshold value to be compared with an output signal in order to detect an L level are different, measurement results of both edges can have an error when measuring a timing of the rising edge that varies from an L level to an H level and a timing of the trailing edge that varies from an H level to an L level.

Moreover, as another reason, when the output signal passes through a logic circuit, a buffer, etc. in a testing device, the difference of a propagation delay time between the rising edge and the trailing edge is considered.

In this way, by various reasons, the above-described measurement error occurs. It is desirable to reduce such a measurement error in order to test a device having a faster operation speed. However, even if circuit characteristics in a testing device are adjusted in order to reduce such a measurement error, it is difficult to sufficiently reduce the measurement error and also to make such a correction circuit. Moreover, it is unfavorable in consideration of design cost.

SUMMARY OF THE INVENTION

Therefore, it is an object of the present invention to provide a detection apparatus, a detection method, and a program that can solve the foregoing problems. The above and other objects can be achieved by combinations described in the independent claims. The dependent claims define further advantageous and exemplary combinations of the present invention.

To solve this problem, according to the first aspect of the present invention, there is provided a detection apparatus that detects a point of transition of a signal level of an output signal output from an electronic device. The detection apparatus includes: a transition point detecting unit operable to receive the output signal to detect the point of transition; a timing comparing unit operable to detect the signal level of the output signal in front of or behind the point of transition in the output signal; and a correction unit operable to compensate the timing of the point of transition detected from the transition point detecting unit based on the signal level of the output signal detected from the timing comparing unit.

The timing comparing unit may detect the signal level of the output signal in the timing away from the point of transition by a predetermined time. Moreover, the detection apparatus may further include an edge type deciding unit operable to decide which of a rising edge or a trailing edge is the point of transition based on the signal level detected from the timing comparing unit, and the correction unit may compensate the timing of the point of transition detected from the transition point detecting unit based on a decision result by the edge type deciding unit.

The detection apparatus may further include a correction value storing unit operable to store a plurality of correction values respectively corresponding to the rising edge and the trailing edge, and the correction unit may compensate the timing of the point of transition by means of the correction value according to the decision result by the edge type deciding unit. Moreover, the detection apparatus may further include a correction value storing unit operable to store a predetermined correction value, and the correction unit may compensate the timing of the point of transition by means of the correction value stored on the correction value storing unit when the decision result by the edge type deciding unit is a predetermined result.

The detection apparatus may further include a multi-strobe generating unit operable to generate a plurality of strobes showing a plurality of timings having phases different from one another, the multi-strobe generating unit having a plurality of variable delay circuits that sequentially delays strobe signals and is connected to one another in series, the timing comparing unit may be provided in correspondence with the variable delay circuit, have a plurality of comparators that detects the signal level of the output signal in the timing of the strobe signal output from the corresponding variable delay circuit, and detect the signal level of the output signal in the plurality of timings shown by the plurality of strobes, the transition point detecting unit may detect the point of transition when the two signal levels in adjacent timings are different among the plurality of signal levels according to the plurality of timings, and the edge type deciding unit may receive the signal level in the timing in front of or behind the point of transition among the plurality of signal levels detected from the timing comparing unit, and decides which of the rising edge or the trailing edge shows the point of transition based on the received signal level.

The transition point detecting unit may include: a plurality of exclusive OR circuits that receives the two signal levels in the adjacent timing and outputs an H logic when the corresponding two signal levels are different; and an encoder that generates an encoding signal showing the timing of the point of transition based on an output result of the plurality of exclusive OR circuits.

The correction unit may include: an addition unit that receives the encoding signal and outputs a correction signal by adding the correction value to the encoding signal; and a selection unit that receives the encoding signal and the correction signal and outputs either of the encoding signal or the correction signal as the timing of the point of transition according to the decision result by the edge type deciding unit.

The edge type deciding unit may further decide whether the transition point detecting unit has detected the point of transition based on the encoding signal, and the selection unit may select and output either of the encoding signal or the correction signal further based on whether the transition point detecting unit has detected the point of transition.

The correction unit may include: a fail memory that stores the timing of the point of transition detected from the transition point detecting unit and the type of edge decided by the edge type deciding unit in association with each other; and a correcting means that compensates the timing of the corresponding point of transition based on the type of edge stored on the fail memory.

According to the second aspect of the present invention, there is provided a detection method detecting a point of transition of a signal level of an output signal output from an electronic device. The detection method includes: a transition point detecting step receiving the output signal to detect the point of transition; a timing comparing step detecting the signal level of the output signal in front of or behind the point of transition in the output signal; and a correcting step correcting the timing of the point of transition detected in the transition point detecting step based on the signal level of the output signal detected in the timing comparing step.

According to the third aspect of the present invention, there is provided a program making a detection apparatus detect a point of transition of a signal level of an output signal output from an electronic device. The program makes the detection apparatus function as: a transition point detecting unit operable to receive the output signal to detect the point of transition; a timing comparing unit operable to detect the signal level of the output signal in front of or behind the point of transition in the output signal; and a correction unit operable to compensate the timing of the point of transition detected from the transition point detecting unit based on the signal level of the output signal detected from the timing comparing unit.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
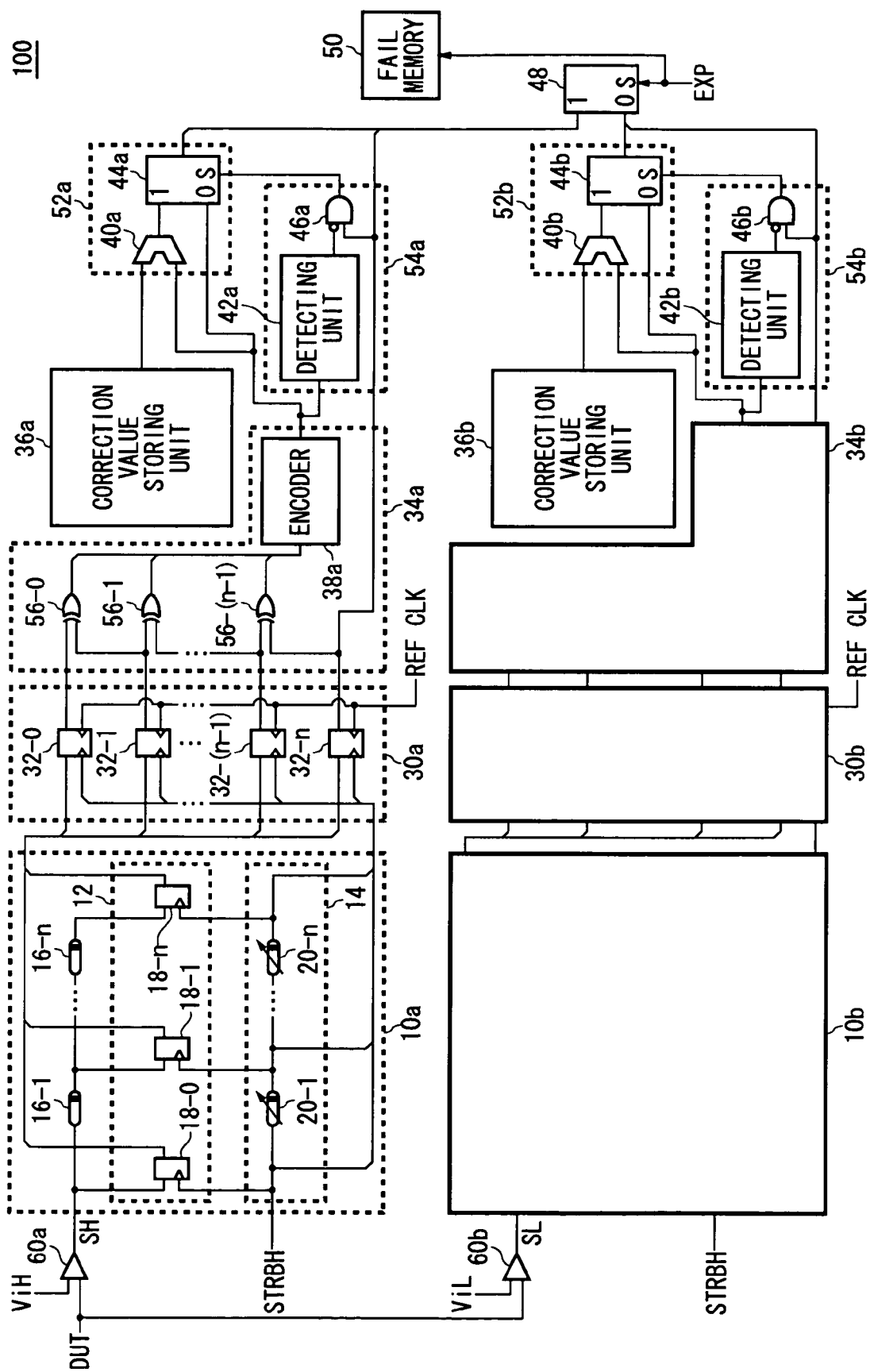
FIG. 1 is a view exemplary showing a configuration of a detection apparatus according to an embodiment of the present invention.

FIG. 1 is a view exemplary showing a configuration of a detection apparatus 100 according to an embodiment of the present invention. The detection apparatus 100 detects a point of transition of a signal level of an output signal output from an electronic device that it is a device under test (DUT), and compensates the timing of the detected point of transition. The detection apparatus 100 includes a plurality of multi-strobe circuits 10a and 10b, a plurality of buffer units 30a and 30b, a plurality of transition point detecting units 34a and 34b, a plurality of correction value storing units 36a and 36b, a plurality of correction units 52a and 52b, a plurality of edge type deciding units 54a and 54b, a selection circuit 48, and a fail memory 50.

The multi-strobe circuit 10a receives the output signal output from the electronic device via an outside level comparator 60a. The level comparator 60a compares the output signal with a given threshold value ViH, and converts the output signal into a binary signal of an H level or an L level.

The multi-strobe circuit 10a has a multi-strobe generating unit 14, a timing comparing unit 12, and a plurality of delay circuits 16-1 to 16-n connected to one another in series. The multi-strobe generating unit 14 has a plurality of variable delay circuits 20-1 to 20-n connected to one another in series, and generates a plurality of strobes showing a plurality of timings having phases different from one another. Each of the variable delay circuits 20-1 to 20-n receives a strobe signal STRBH from an outside or former variable delay circuit and sequentially delays the signal to output the result, in order to generate a multi-strobe having a plurality of strobe signals that has phases different from one another.

The timing comparing unit 12 has a plurality of comparators 18-0 to 18-n, and detects the signal levels of the output signals in the plurality of timings by means of the multi-strobe generated from the multi-strobe generating unit 14. The comparators 18-1 to 18-n are provided corresponding to the variable delay circuits 20-1 to 20-n, and detects the signal levels of the output signals in the timings of the strobe signals output from the corresponding variable delay circuits 20-1 to 20-n. Moreover, the comparator 18-0 detects the signal level of the output signal in the timing shown by the strobe signal that is supplied to the multi-strobe generating unit 14.

The plurality of delay circuits 16-1 to 16-n is provided corresponding to the comparators 18-1 to 18-n. The plurality of delay circuits 16-1 to 16-n receives an output signal SH, and sequentially delays the signal to supply the result to the corresponding comparators 18-1 to 18-n. Each of the comparators 18-1 to 18-n detects the signal level of the received output signal according to the strobe signal generated from the corresponding variable delay circuits 16-1 to 16-n. It is desirable that the delay amount of each of the delay circuits 16-1 to 16-n is set to be the substantially same delay amount as an offset delay amount of the variable delay circuits 20-1 to 20-n. In this way, it is possible to compensate an error between the timing of the strobe signal to be generated and the timing of the strobe signal being really generated, which is caused by the offset delay amount in the variable delay circuits 20-1 to 20-n, and to detect the signal level.

The buffer unit 30a has a plurality of FIFO circuits 32-0 to 32-n that is provided corresponding to the plurality of comparators 18-0 to 18-n. In this example, the FIFO circuit 32-n is provided corresponding to the comparator 18-0 and the FIFO circuit 32-0 is provided corresponding to the comparator 18-n. The plurality of FIFO circuits 32-0 to 32-n receives the signal levels of the output signals detected from the corresponding comparators 18-0 to 18-n, and respectively synchronizes the received signal levels with a reference clock REFCLK to sequentially output the signal levels.

The transition point detecting unit 34a detects a point of transition of the output signal based on the signal level of the output signal received from the buffer unit 30a. Here, the point of transition means a point at which a signal level of an output signal changes from a predetermined subthreshold signal level to a predetermined over threshold signal level or from a predetermined over threshold signal level to a predetermined subthreshold signal level.

The transition point detecting unit 34a detects the point of transition when two signal levels in adjacent timing are different among the plurality of signal levels according to the plurality of timings detected from the comparators 18-0 to 18-n. In this example, the transition point detecting unit 34a has a plurality of exclusive OR circuits 56-0 to 56-(n−1) that receives two signal levels in adjacent timing and outputs an H logic when the two corresponding signal levels are different and an encoder 38a that generates an encoding signal showing the timing of the point of transition based on an output result from the plurality of exclusive OR circuits 56-0 to 56-(n−1). For example, the encoder 38a converts an n-bit signal output from the plurality of exclusive OR circuits 56-0 to 56-(n−1) into a binary signal. In other words, although the n-bit signal output from the plurality of exclusive OR circuits 56-0 to 56-(n−1) shows the timing of the point of transition by means of a bit position showing the H logic, the encoder 38a converts the n-bit signal into a signal showing the timing of the point of transition with a numeric value.

The edge type deciding unit 54a decides which of a rising edge or a trailing edge shows a point of transition based on the signal level detected from the timing comparing unit 12. In this example, the edge-detection unit 54a receives the signal level received from the FIFO circuit 32-n as an edge decision bit, and decides the type of edge of the point of transition based on the edge decision bit. The FIFO circuit 32-n receives the signal level detected from the comparator 18-0, i.e., the signal level in front of the point of transition. The edge type deciding unit 54a decides that the point of transition is a trailing edge when the edge decision bit is an H level and decides that the point of transition is a rising edge when the edge decision bit is an L level.

Moreover, the edge type deciding unit 54a may use the signal level detected from the other comparator 18 as an edge decision bit. For example, the signal level detected from the comparator 18-0, i.e., the signal level behind the point of transition may be used as an edge decision bit. Similarly, in this case, it can be decided which of a rising edge or a trailing edge is a point of transition.

The correction unit 52a compensates the timing of the point of transition detected from the transition point detecting unit 34a based on the decision result from the edge type deciding unit 54a. In other words, the correction unit 52a compensates the timing of the point of transition detected from the transition point detecting unit 34a based on the signal level in front of or behind the point of transition detected from the timing comparing unit 12.

The correction value storing unit 36a stores a correction value with which the correction unit 52a compensates the timing of the point of transition. The correction value storing unit 36a may store one predetermined correction value, or may store a plurality of correction values corresponding to each of a rising edge and a trailing edge. When the correction value storing unit 36a stores one correction value, the correction unit 52a compensates the timing of the point of transition using the correction value stored on the correction value storing unit 36a when the decision result by the edge type deciding unit 54a is a predetermined result. When the correction value storing unit 36a stores the plurality of correction values, the correction unit 52a compensates the timing of the point of transition using the correction value according to the decision result by the edge type deciding unit 54a. In this example, it will be described about when the correction value storing unit 36a stores one correction value.

The correction unit 52a has an addition unit 40a that receives an encoding signal and outputs a correction signal made by adding the correction value stored on the correction value storing unit 36a to the encoding signal and a selection unit 44a that receives the encoding signal and the correction signal and outputs either of the encoding signal or the correction signal as the timing of the point of transition according to the decision result by the edge type deciding unit 54a. In this example, the selection unit 44a outputs the correction signal to which the correction value is added by the addition unit 40a when the edge type deciding unit 54a detects a trailing edge and outputs the encoding signal when the edge type deciding unit 54a detects a rising edge. In this way, it is possible to compensate a relative error between the timing of the rising edge and the timing of the trailing edge.

Moreover, the edge type deciding unit 54a may decide whether the transition point detecting unit 34a has detected the point of transition based on the encoding signal, and the selection unit 44a may select and output either of the encoding signal or the correction signal further based on whether the transition point detecting unit 34a has detected the point of transition. In this case, the edge type deciding unit 54a has a detecting unit 42a and an AND circuit 46a.

When the transition point detecting unit 34a does not detect the point of transition, the encoder 38a outputs a signal showing zero. The detecting unit 42a receives the encoding signal and decides whether the encoding signal shows zero, and thus decides whether the transition point detecting unit 34a has detected the point of transition. The AND circuit 46a causes the selection unit 44a to select the correction signal when the encoding signal is not zero and the point of transition is a trailing edge and causes the selection unit 44a to select the encoding signal when the encoding signal is zero or the point of transition is a rising edge.

In this example, it has been described about when a correction value corresponding to a trailing edge is stored on the correction value storing unit 36*a*. However, although the correction value storing unit 36*a* stores a correction value corresponding to a rising edge, it is possible to compensate the timing of the point of transition by a similar operation.

Moreover, the timing comparing unit 12 may detect a signal level of an output signal in the timing away from the point of transition by a predetermined time and the correction unit 52*a* may compensate the timing of the point of transition based on the signal level of the output signal in the timing away from the point of transition by a predetermined time. For example, when an analog output signal is given, after an inclination of the point of transition is computed based on timing difference between the timing of the point of transition and the timing of the detected signal level, the timing of the point of transition may be corrected based on the computed inclination. In this case, although a waveform of an output signal varies according to a frequency of the output signal, it is possible to compensate the timing of the point of transition based on the inclination of the waveform.

Moreover, the multi-strobe circuit 10*b*, the buffer unit 30*b*, the transition point detecting unit 34*b*, the correction value storing unit 36*b*, the edge type deciding unit 54*b*, and the correction unit 52*b* have the same or similar function and configuration as or to those of the multi-strobe circuit 10*a*, the buffer unit 30*a*, the transition point detecting unit 34*a*, the correction value storing unit 36*a*, the edge type deciding unit 54*a*, and the correction unit 52*a*. The multi-strobe circuit 10*b* receives the output signal SL via an outside level comparator 60*b*. The level comparator 60*b* receives an output signal from the electronic device, compares the output signal and a given threshold value ViL, and converts the output signal into a binary signal of an H level or an L level to output the result. In this example, the level comparator 60*b* receives a signal having the substantially same value as the threshold value ViH as a threshold value ViL, and outputs the output signal generally turned over in comparison with the output signal output from the level comparator 60*a*. Moreover, in another case, the threshold value ViL and the threshold value ViH may not be equal to each other.

The selection circuit 48 selects either of the timing of the point of transition output from the correction unit 52*a* and the decision result output from the edge type deciding unit 54*a* or the timing of the point of transition output from the correction unit 52*b* and the decision result output from the edge type deciding unit 54*b*, and stores the result on the fail memory 50.

As described above, according to the detection apparatus 100 of this example, it is possible to easily compensate a relative error between the timing detecting a point of transition when the point of transition is a rising edge and the timing detecting a point of transition when the point of transition is a trailing edge.

Figure 2:
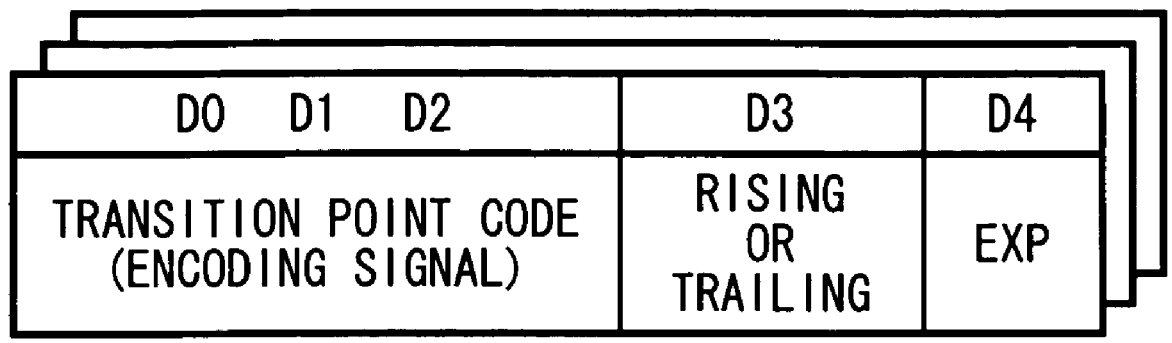
FIG. 2 is a view exemplary showing a data configuration in a fail memory.

FIG. 2 is a view exemplary showing a data configuration in the fail memory 50. The fail memory 50 stores the timing of the point of transition (the transition point code) output from the correction unit 52*a*, which of a rising edge or a trailing edge is the point of transition, and which of the output signal SH or the output signal SL is the point of transition (EXP) in association with one another. Moreover, in another example, the fail memory 50 may store the encoding signal output from the encoder 38 in place of the transition point code. In this case, the detection apparatus 100 compensates the timing of the point of transition shown by the encoding signal stored on the fail memory 50 based on which of a rising edge or a trailing edge is the point of transition. For example, the detection apparatus 100 may further include an arithmetic unit as a correcting means that performs that correction.

Figure 3:
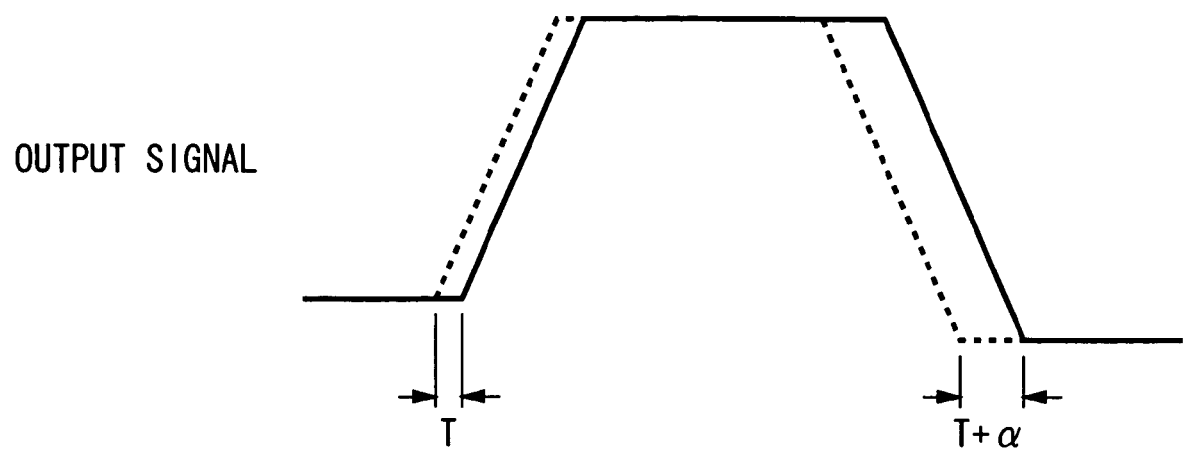
FIG. 3 is a view exemplary showing a waveform of an output signal output from an electronic device.

FIG. 3 is a view exemplary showing a waveform of an output signal output from the electronic device. When the electronic device has output an output signal, the output signal passes through a circuit such as a logic circuit and a buffer until the signal is input to the multi-strobe circuit 10. At this time, the output signal is delayed. However, the delay time is different from a rising edge and a trailing edge of the output signal. For example, the rising edge is delayed by the time T and the trailing edge is delayed by the time T+α. For this reason, when measuring the output signal as it is, it is not possible to measure what kind of waveform has the electronic device output with high precision. The detection apparatus 100 described in FIG. 1 can measure the output signal output from the electronic device with high precision by correcting a gap in the timing by such an edge type.

Moreover, a gap in the detection timing can be caused by an edge type due to a hysteresis characteristic of a comparator in some cases. The detection apparatus 100 described in FIG. 1 can correct such a gap in the timing.

Figure 4:
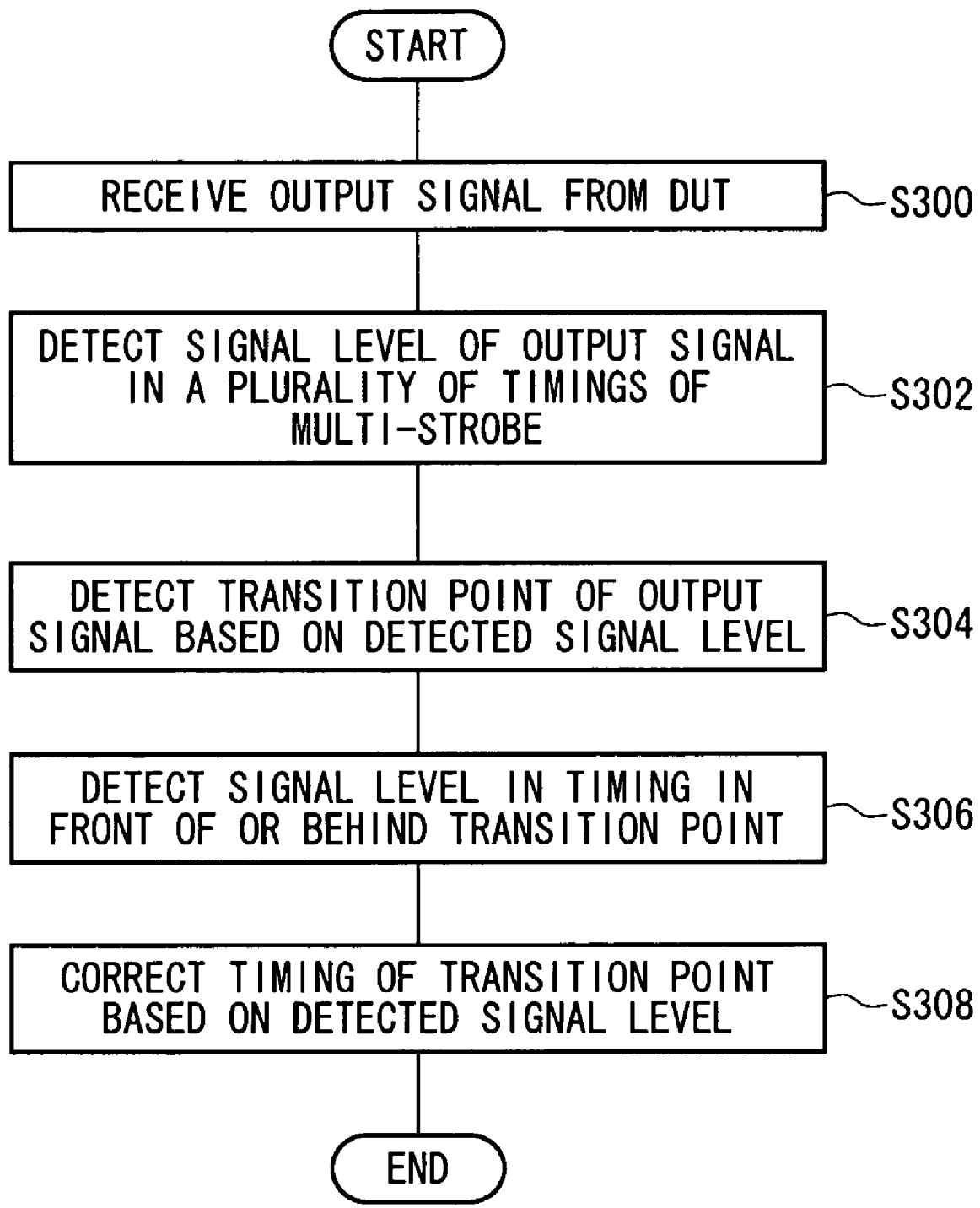
FIG. 4 is a view exemplary showing an operation of the detection apparatus explained in FIG. 1.

FIG. 4 is a view exemplary showing an operation of the detection apparatus 100 explained in FIG. 1. At first, the detection apparatus 100 receives an output signal from the electronic device (S300). Next, the multi-strobe circuit 10 generates a multi-strobe, and detects a signal level of the output signal in a plurality of timings of the multi-strobe (S302). Next, the transition point detecting unit 34 detects a point of transition based on the signal level (S304). Next, the signal level the timing in front of or behind the point of transition is detected, and the edge type of the point of transition is decided (S306). In this example, the edge type of the point of transition is decided using the signal level detected from the comparator 18-n that is provided in the last stage among the plurality of comparators 18-0 to 18-n in S306. Next, the correction unit 52 compensates the timing of the point of transition based on the detected signal level, i.e., the edge type of the point of transition (S308).

Figure 5:
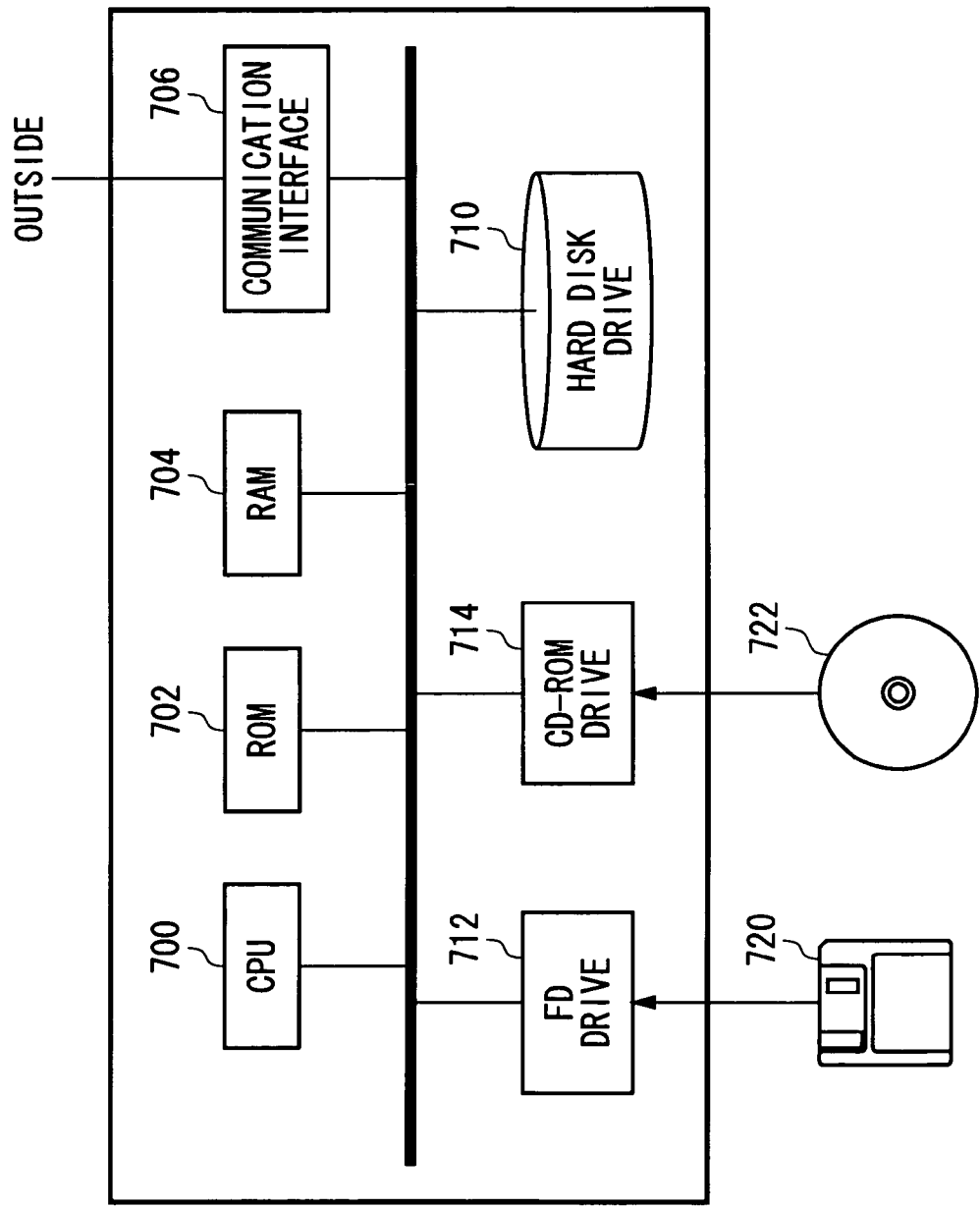
FIG. 5 is a view exemplary showing a configuration of a computer that controls the detection apparatus.

FIG. 5 is a view exemplary showing a configuration of a computer 200 that controls the detection apparatus 100. The computer 200 controls the detection apparatus 100 according to a program that makes the detection apparatus 100 detect the point of transition of the signal level of the output signal output from the electronic device. In other words, the computer 200 stores a program that makes the detection apparatus 100 function as described in FIGS. 1 to 4. The computer 200 includes a CPU 700, a ROM 702, a RAM 704, a communication interface 706, a hard disk drive 710, an FD disk drive 712, and a CD-ROM drive 716. The CPU 700 operates based on a program stored on the ROM 702, the RAM 704, the hard disk 710, the FD disk 714, and/or the CD-ROM 718.

The communication interface 706 communicates with the detection apparatus 100 to cause the detection apparatus 100 to function as the detection apparatus 100 explained in FIGS. 1 to 4. The hard disk drive 710 as an example of a storing apparatus stores setting information and a program to operate the CPU 700. The ROM 702, the RAM 704, and/or the hard disk drive 710 stores a program for making the detection apparatus 100 function as the detection apparatus 100 described in FIGS. 1 to 4.

The flexible disk drive 712 reads a program from the flexible disk 714 to provide it to the CPU 700. The CD-ROM drive 716 reads a program from the CD-ROM 718 to provide it to the CPU 700.

Moreover, the program may directly be read from the recording medium to the RAM to be executed, or may be read to the RAM to be executed after being installed in the hard disk drive once. Furthermore, the program may be stored on single recording medium, or may be stored on a plurality of recording media. Moreover, the program stored on the recording medium may provide each function jointly with an operating system. For example, the program may request all or some of the functions to the operating system, and provide the functions based on the answer from the operating system.

The recording medium storing a program can include an optical recording medium such as DVD and PD, a magneto-optical recording medium such as MD, a tape medium, a magnetic recording medium, a semiconductor memory such as an IC card and a miniature card besides the flexible disk and the CD-ROM. Moreover, a storing apparatus such as the hard disk and the RAM that are provided in a server system connected to a private communication network and an Internet may be used as a recording medium.

Moreover, the computer 200 may have the function of the fail memory 50 and the correcting means described in FIGS. 1 and 2. For example, the computer 200 may store the encoding signal output from the encoder 38, and correct the stored encoding signal according to the edge type of the point of transition. In this case, the computer 200 corrects the encoding signal by means of a correction value previously given.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

INDUSTRIAL APPLICABILITY

As apparent from the above descriptions, according to the present invention, it is possible to measure the timing of a point of transition of an output signal output from an electronic device with high precision.

What is claimed is:

1. A detection apparatus that detects a point of transition of a signal level of an output from an electronic device, comprising:
    a transition point detecting unit operable to receive the output signal to detect the point of transition;
    a timing comparing unit operable to detect the signal level of the output signal in front of or behind the point of transition in the output signal; and
    a correction unit operable to compensate the timing of the point of transition detected from said transition point detecting unit based on the signal level of the output signal detected from said timing comparing unit; and
    an edge type deciding unit operable to decide which of a rising edge or a trailing edge is the point of transition based on the signal level detected from said timing comparing unit,
    wherein said correction unit compensates the timing of the point of transition detected from said transition point detecting unit based on a decision result by said edge type deciding unit.

2. The detection apparatus as claimed in claim 1, wherein said timing comparing unit detects the signal level of the output signal in the timing away from the point of transition by a predetermined time.

3. The detection apparatus as claimed in claim 1, wherein the detection apparatus further comprises a correction value storing unit operable to store a plurality of correction values respectively corresponding to the rising edge and the trailing edge, and said correction unit compensates the timing of the point of transition by means of the correction value according to the decision result by said edge type deciding unit.

4. The detection apparatus as claimed in claim 1, wherein the detection apparatus further comprises a correction value storing unit operable to store a predetermined correction value, and said correction unit compensates the timing of the point of transition by means of the correction value stored on said correction value storing unit when the decision result by said edge type deciding unit is a predetermined result.

5. The detection apparatus as claimed in claim 3, wherein
    the detection apparatus further comprises a multi-strobe generating unit operable to generate a plurality of strobes showing a plurality of timings having phases different from one another, the multi-strobe generating unit having a plurality of variable delay circuits that sequentially delays strobe signals and is connected to one another in series,
    said timing comparing unit is provided in correspondence with the variable delay circuit, has a plurality of comparators that detects the signal level of the output signal in the timing of the strobe signal output from the corresponding variable delay circuit, and detects the signal level of the output signal in the plurality of timings shown by the plurality of strobes,
    said transition point detecting unit detects the point of transition when the two signal levels in adjacent timings are different among the plurality of signal levels according to the plurality of timings, and
    said edge type deciding unit receives the signal level in the timing in front of or behind the point of transition among the plurality of signal levels detected from said timing comparing unit, and decides which of the rising edge or the trailing edge shows the point of transition based on the received signal level.

6. The detection apparatus as claimed in claim 4, wherein
    the detection apparatus further comprises a multi-strobe generating unit operable to generate a plurality of strobes showing a plurality of timings having phases different from one another, the multi-strobe generating unit having a plurality of variable delay circuits that sequentially delays strobe signals and is connected to one another in series,
    said timing comparing unit is provided in correspondence with the variable delay circuit, has a plurality of comparators that detects the signal level of the output signal in the timing of the strobe signal output from the corresponding variable delay circuit, and detects the signal level of the output signal in the plurality of timings shown by the plurality of strobes,
    said transition point detecting unit detects the point of transition when the two signal levels in adjacent timings are different among the plurality of signal levels according to the plurality of timings, and
    said edge type deciding unit receives the signal level in the timing in front of or behind the point of transition among the plurality of signal levels detected from said timing comparing unit, and decides which of the rising edge or the trailing edge shows the point of transition based on the received signal level.

7. The detection apparatus as claimed in claim 5, wherein said transition point detecting unit comprises:
    a plurality of exclusive OR circuits that receives the two signal levels in the adjacent timing and outputs an H logic when the corresponding two signal levels are different; and an encoder that generates an encoding signal showing the timing of the point of transition based on an output result of the plurality of exclusive OR circuits.

8. The detection apparatus as claimed in claim 6, wherein said transition point detecting unit comprises:
   a plurality of exclusive OR circuits that receives the two signal levels in the adjacent timing and outputs an H logic when the corresponding two signal levels are different; and
   an encoder that generates an encoding signal showing the timing of the point of transition based on an output result of the plurality of exclusive OR circuits.

9. The detection apparatus as claimed in claim 7, wherein said correction unit comprises:
   an addition unit that receives the encoding signal and outputs a correction signal by adding the correction value to the encoding signal; and
   a selection unit that receives the encoding signal and the correction signal and outputs either of the encoding signal or the correction signal as the timing of the point of transition according to the decision result by said edge type deciding unit.

10. The detection apparatus as claimed in claim 8, wherein said correction unit comprises:
   an addition unit that receives the encoding signal and outputs a correction signal by adding the correction value to the encoding signal; and
   a selection unit that receives the encoding signal and the correction signal and outputs either of the encoding signal or the correction signal as the timing of the point of transition according to the decision result by said edge type deciding unit.

11. The detection apparatus as claimed in claim 9, wherein
   said edge type deciding unit further decides whether said transition point detecting unit has detected the point of transition based on the encoding signal, and
   said selection unit selects and outputs either of the encoding signal or the correction signal further based on whether said transition point detecting unit has detected the point of transition.

12. The detection apparatus as claimed in claim 10, wherein
   said edge type deciding unit further decides whether said transition point detecting unit has detected the point of transition based on the encoding signal, and
   said selection unit selects and outputs either of the encoding signal or the correction signal further based on whether said transition point detecting unit has detected the point of transition.

13. The detection apparatus as claimed in claim 1, wherein said correction unit comprises:
   a fail memory that stores the timing of the point of transition detected from said transition point detecting unit and the type of edge decided by said edge type deciding unit in association with each other; and
   a correcting means that compensates the timing of the corresponding point of transition based on the type of edge stored on the fail memory.

14. A detection method detecting a point of transition of a signal level of an output signal output from an electronic device, comprising:
   a transition point detecting step of receiving the output signal to detect the point of transition;
   a timing comparing step of detecting the signal level of the output signal in front of or behind the point of transition in the output signal;
   a correcting step of correcting the timing of the point of transition detected in said transition point detecting step based on the signal level of the output signal detected in said timing comparing step; and
   an edge type deciding step of deciding which of a rising edge or a trailing edge is the point of transition based on the signal level detected in said timing comparing step.
   wherein said correcting step includes compensating by a correction unit, the timing of the point of transition detected in said transition point detecting step based on a decision result of said edge type deciding step.

15. A computer program product having computer instructions, recorded on a computer medium, for enabling a computer executing the computer instructions to perform operations, comprising a program making a detection apparatus detect a point of transition of a signal level of an output signal output from an electronic device, the program making the detection apparatus function as:
   a transition point detecting unit operable to receive the output signal to detect the point of transition;
   a timing comparing unit operable to detect the signal level of the output signal in front of or behind the point of transition in the output signal;
   a correction unit operable to compensate the timing of the point of transition detected from said transition point detecting unit based on the signal level of the output signal detected from said timing comparing unit; and
   an edge type deciding unit operable to decide which of a rising edge or a trailing edge is the point of transition based on the signal level detected from said timing comparing unit,
   wherein said correction unit compensates the timing of the point of transition detected from said transition point detecting unit based on a decision result by said edge type deciding unit.

* * * * *